United States Patent [19]
Nishizawa et al.

[11] Patent Number: 4,791,396
[45] Date of Patent: Dec. 13, 1988

[54] COLOR IMAGE SENSOR

[75] Inventors: Jun-ichi Nishizawa, 6-16, Komegafukuro 1-chome; Takashige Tamamushi, 3-8, Tsunogoro 1-chome, both of Sendai-shi, Miyagi; István Bársony, Hamamatu, all of Japan

[73] Assignees: Jun-ichi Nishizawa; Takashige Tamamushi, both of Miyagi; Research Development Corporation, Tokyo, all of Japan

[21] Appl. No.: 772,338

[22] PCT Filed: Dec. 21, 1984

[86] PCT No.: PCT/JP84/00606
  § 371 Date: Aug. 28, 1985
  § 102(e) Date: Aug. 28, 1985

[87] PCT Pub. No.: WO85/03166
  PCT Pub. Date: Jul. 18, 1985

[30] Foreign Application Priority Data

Dec. 29, 1983 [JP] Japan .................. 58-249546

[51] Int. Cl.$^4$ .............................. H01L 29/80
[52] U.S. Cl. .......................... 357/22; 357/30
[58] Field of Search .............. 357/22 B, 30 D, 30 I, 357/30 H

[56] References Cited

U.S. PATENT DOCUMENTS

| | | | |
|---|---|---|---|
| 4,365,262 | 12/1982 | Nishizawa | 357/31 |
| 4,450,466 | 5/1984 | Nishizawa | 357/30 D |
| 4,556,909 | 12/1985 | Yamada | 357/22 B |
| 4,613,881 | 9/1986 | Nishizawa | 357/22 B |
| 4,651,015 | 3/1987 | Nihizawa | 357/30 I |
| 4,673,985 | 1/1987 | Nishizawa | 357/30 I |

FOREIGN PATENT DOCUMENTS 54-158121 12/1979 Japan .
56-162885 12/1981 Japan .
57-49266 3/1982 Japan .

*Primary Examiner*—Martin H. Edlow
*Attorney, Agent, or Firm*—Staas & Halsey

[57] ABSTRACT

The present invention relates generally to a photodetector, and more particularly to a photodetector formed by a static induction transistor. The present invention includes the following constituent elements:

In the photodetector formed by a static induction transistor, an n$^+$-type buried layer is provided, as a drain or source region of the photodetector, for limiting the thickness of a high resistivity i-type layer between a p$^+$-type region forming a gate and a substrate. Letting the wavelength of light incident to the surface of the photodetector and an absorption coefficient for the incident light be represented by $\lambda_i$ and $\alpha_i(\lambda_i)$, respectively, the distance between the in junction of the abrupt pin junction and the surface of the photodetector $x_i$ is $$\frac{1}{\alpha_i(\lambda_i)},$$

the ratio between the area $A(\lambda_i)$ of each gate portion for selectively detecting light of the specified wavelength $\lambda_i$ and the total area $A_{tot}$ of the gate is selected as follows:

$$\frac{A(\lambda_i)}{A_{tot}} = e\eta(\lambda_i) \frac{1}{1 - R(\lambda_i)}$$

where e = 2.718, $\eta(\lambda_i)$ is required quantum efficiency for the wavelength $\lambda_i$ and $R(\lambda_i)$ 15 a refractive index for the wavelength $\lambda_i$, and the thickness Wi of a depletion layer and the maximum depth $x_{imax}$ of the depletion layer for detecting the specified wavelength $\lambda_i$ are selected as follows:

$$Wi = x_{imax}\left(1 - \frac{1}{e}\right) \text{ and } x_{imax} = \frac{1}{\alpha_i(\lambda_i)},$$

thereby providing selective spectral responsivity for the specified wavelength $\lambda_i$. Letting three specified wavelengths of blue, green and red light be represented by $\lambda_1$, $\lambda_2$ and $\lambda_3$, the total area of the gate is $A_{tot}=A(\lambda_1)+A(\lambda_2)+A(\lambda_3)$. Pixels for detecting the three wave- (Abstract continued on next page.)

lengths are arranged in a honeycomb-like pattern, as shown in FIG. 8. For obtaining the maximum photodetection sensitivity for the three wavelengths, for example, 460, 550 and 660 nm, the diffusion depth $x_{jp+}$ of the gate portions and the depletion layer width Wi between the gate and the n+-type buried source region are selected as given below in Table 1:

TABLE 1

|   | $x_{imax}$ | Wi | $x_{jp+max}$ | $-x_{jn+}$ | $\lambda$ |
|---|---|---|---|---|---|
| B | 0.63 μm | 0.4 | 0.2 | 3.0 | 460 nm |
| G | 1.53 μm | 0.9 | 0.5 | 2.2 | 550 |
| R | 3.57 μm | 2.3 | 1.3 | 0 | 660 |

3 Claims, 9 Drawing Sheets

COLOR IMAGE SENSOR

BACKGROUND OF THE INVENTION

1. Field of the Invention

The present invention relates to a static induction phototransistor type photodetector which has photodetection sensitivity corresponding to a desired spectral responsivity character, and more particularly to a solid-state color image sensor which utilizes the characteristics of the above photodetector.

2. Description of the Related Art

The operation of a photodetector employing a static induction transistor (hereinafter referred to as an SIT) is based on the principles that the gate potential of the SIT is determined by light directed thereto, whereas the potential barrier height in a channel is controlled by a static induction effect of gate and drain voltages. In consequence, the SIT as a photo detecting device features a high current gain, a high signal-to-noise ratio, a wide dynamic range and a high-frequency operation. There have already been proposed by the present inventors SIT photodetectors of various structures (Pat. Appln. No. 192417/81: Pat. Pub. Disc. No. 93386/83). On the other hand, applications have also been made to an image sensor (hereinafter referred to as an SIT image sensor) through utilization of such features of the SIT photodetector as a high current gain (a high optical gain), a high signal-to-noise ratio, a wide dynamic range and a high-frequency operation, and they have already been disclosed by the present inventors in Pat. Appln. No. 87988/78 (Pat. Pub. Disc. No. 15229/80), Pat. Appln. No. 204656/81 (Pat. Pub. Disc. No. 105672/83) and Pat. Appln. No. 157693/82 (Pat. Pub. Disc. No. 45781/84). An attempt to improve the wavelength character, in particular, blue light response on the side of the shorter wavelength in the SIT photodetector or a gate storage type SIT image sensor has already been disclosed in Pat. Appln. No. 217751/82 (Pat. Pub. Disc. No. 108458/84) and Pat. Appln. No. 218926/82 (Pat. Pub. Disc. No. 108472/84). The proposed method is to make structural improvements on the gate section of a pixel of the SIT image sensor. A prior art example is shown in FIG. 1.

Figure 1A:
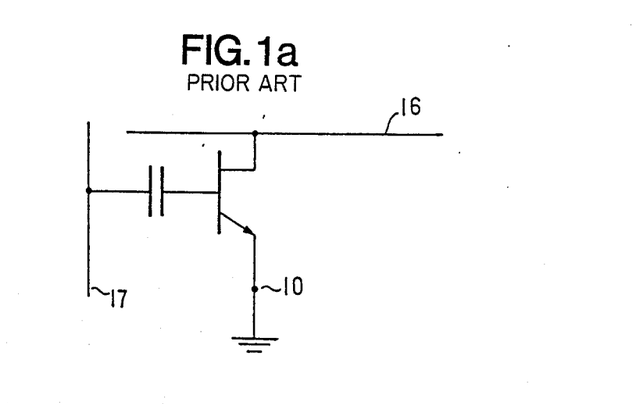
FIGS. 1(a) and 1(b) illustrate a conventional gate storage mode SIT photodetector or image sensor, FIG. 1(a) showing an equivalent circuit and FIG. 1(b) its device structure in cross-section.
Figure 1B:
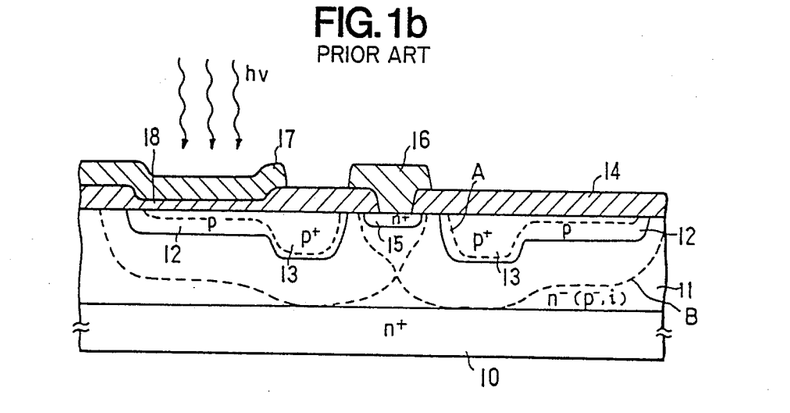

FIG. 1 illustrates one pixel of the gate storage type SIT image sensor with increased spectral response for the shorter wavelength, (a) showing the circuit arrangement of the device and (b) its sectional structure. With reference to FIG. 1, respective parts of the device will be described. Reference numeral 10 indicates an n+-type substrate or buried layer, which serves as a source region of the SIT section. Reference numeral 11 designates an n−-, p−- or i-type high resistivity layer, which forms a channel portion of the SIT. A p+-type region 13 formed by a thick diffused region is the gate of the SIT, which is provided for controlling a current flow between an n+-type drain 15 and the n+-type source 10. A p-type region 12 formed by a relatively thin diffused region is also the gate of the SIT, which is not for current control use but for detecting shorter wavelength light of a relatively small pentration depth. The broken line A shows a depletion layer spreading in the gates 12 and 13, and the broken line B a depletion layer spreading in the high resistivity layer 11. Reference numeral 14 identifies an insulating film of SiO$_2$ or the like. An electrode 16 serves as a drain electrode and, at the same time, forms a signal readout line. An electrode 17 forms a capacitor between it and the p-type gate 12 with a thin insulating film 18 sandwiched therebetween and, at the same time, serves as a gate address line. Thus an image sensor of the X-Y address system is constituted. As is evident from the spreading of the depletion layer shown in FIG. 1(b), comparison of a pin diode made up of the p+-type region 13, the n−(p−, i)-type layer 11 and the n+-type region 10 and a pin diode made up of the p-type region 12, the n−(p−, i)-type layer 11 and the n+-type region 10, in terms of photodetection sensitivity, indicates that the p(12) n−(11)n+(10) diode is excellent in the spectral response for the shorter wavelength, whereas the p+(13)n−(11)n+(10) diode detects wave light of a relatively large penetration depth.

Sometimes the device of the sectional structure shown in FIG. 1 is used as a discrete element, i.e. as one-element SIT photodetector. In such a case, it may be activated in a normal mode in which the n+-type regions 15 and 10 serve as the source and the drain, respectively, or in an inverted mode in which the n+-type regions 15 and 10 serve as the drain and the source, respectively.

In order to provide the blue light response, the gate portion of the SIT operating for photodetection is formed by a thin diffused region 12 and the gate portion of the SIT operating for current control of the SIT is formed by the thick diffused region 13, thus detecting the shorter-wavelength light of a small penetration depth by the thin diffused region 12. Futhermore, an example of a gate structure in which a scarcely diffused but depleted region, formed by making a hole locally in the gate portion of the SIT, is provided in place of the abovesaid thin diffused region for the same purpose as described above, has already been proposed in Pat. Appln. No. 218927/82 (Pat. Pub. Disc. No. 108473/84).

In the above prior art example, it is an important point to decrease the diffusion depth of the gate portion so as to raise the spectral response for the shorter wavelength, in particular, the blue light response. With this method, however, it is difficult to constitute the SIT photodetector or a pixel of the image sensor which has a photodetection sensitivity corresponding to a given spectral responsivity character. That is to say, a decrease in the diffusion depth of the p+-type gate region of the SIT will surely increase the spectral response for a specific short wavelength, but will make it impossible to control the photodetection sensitivity for the other wavelength ranges. The structure of the prior art example is insufficient especially for the construction of the SIT photodetector or a pixel of this image sensor which has a photodetection sensitivity corresponding to a given spectral responsivity character. Furthermore, the gate structure of the prior art involves only two diffusion processes (a shallow diffusion and a deep diffusion) for its formation and is not limited in the thickness of the high resistivity layer 11 between the gates 12 and 13 and the n+-type layer 11. Hence, it is also difficult to achieve a sharp responsivity character for a specific wavelength. Moreover, the prior art example is indefinite in the method of determining specific diffusion depths of the gates, the method of designing the thicknesses of the depletion layers and the limitations on the areas of the gates. In other words, an optimum design from the viewpoint of the spectral responsivity character has not been made in the past.

SUMMARY OF THE INVENTION

An object of the present invention is to propose an SIT photodetector structure or a pixel structure of the image sensor which retains the aforesaid excellent features of the SIT photodetector or pixel of the image sensor and, at the same time, achieves selective and sharp responsivity for some specified wavelengths by the gate portion serving as a photodetector and performs the function of an amplifier by the SIT portion, thereby providing, as an overall character, selective responsivity for some specific wavelengths.

Another object of the present invention is to provide an SIT photodetector or a pixel of an SIT image sensor in which the gate structure serving as a photodetector is given, by a combination of the abovesaid structures, photodetection sensitivity corresponding to a spectral responsivity character not only for specified wavelengths but also for arbitrary ones.

Yet another object of the present invention is to provide an SIT color image sensor in which the gate diffusion depth $x_{jp+}$ and the depletion layer width Wi between the gate and an n+-type buried source region are selected nearly equal to 0.2 μm, 0.5 μm, 1.3 μm and 0.4 μm, 0.9 μm, 2.3 μm, respectively, so as to maximize the photodetection sensitivity for three wavelengths of blue ($\lambda$=450 nm), green ($\lambda$=550 nm) and red ($\lambda$=660 nm) and in which the area of a green pixel is made 1.6 times larger than the areas of red and blue pixels.

The above objects are attained by providing a photodetector-type color image sensor, formed by a static induction transistor comprising an n+-type buried layer, forming one of a drain and a source region which limits the thickness of a high resistivity i-type layer between a P+-type region forming a gate. Letting three specified wavelengths of blue, green and red light be represented by $\lambda_1$, $\lambda_2$ and $\lambda_3$, respectively, a ratio between the area $A(\lambda_i)$ of a gate portion for selectively detecting the light of the specified wavelength $\lambda_i$ (wherein i=1, 2, 3) and the total area of the gate is selected as follows: $[A(\lambda_i)/A_{tot}]=[e\cdot\eta(\lambda_i)]/[1=R(\lambda_i)]$, where e=2.718, $\eta(\lambda_i)$ is a required quantum efficiency for the specific wavelength $\lambda_i$, $R(\lambda_i)$ is a refractive index for the specific wavelength $\lambda_i$ and $A_{tot}=A(\lambda_1)+A(\lambda_2)+A(\lambda_3)$. The gate portion includes areas or pixels for detecting light of the three specified wavelengths arranged in a honeycomb like pattern. The gate portion has a diffusion depth of $X_{jp+}$ and a depletion width Wi between the gate portions and the n+-type buried layer is selected to be close to the following respective values for blue, green and red light: $x_{jp+}=0.2$ μm, 0.5 μm, 1.3 μm and Wi=0.4 μm, 0.9 μm, and 2.3 μm, so that the photodetection sensitivity for the respective wavelengths is maximized. The area of the gate portion for detecting a green light is preferably at least 1.6 times larger than either of the areas of gate portions for detecting red and blue light.

DESCRIPTION OF THE PREFERRED EMBODIMENT

An SIT photodetector is constituted in which an n+-type buried layer, which limits the thickness of a high resistivity layer between the gate portion and a substrate (an n+-type drain), is provided so that the gate portion of the SIT may have selective and sharp responsivity for some specified wavelengths and in which the n+-type buried layer is used as a drain or source region. The area of a p+-type region forming the gate portion of the SIT is divided, and letting $A(\lambda_i)$, $\eta(\lambda_i)$ and $A_{tot}$ stand for the area of a portion for selectively detecting light of a wavelength $\lambda_i$, the quantum efficiency needed for the light of the wavelength $\lambda_i$ and the total area of the gate of the SIT, respectively, the area $A(\lambda_i)$ is selected approximately in such a ratio as expressed by $$\frac{A(\lambda_i)}{A_{tot}} = e \cdot \eta(\lambda_i) \cdot \frac{1}{1 - R(\lambda_i)}$$

where $R(\lambda_i)$ is the refractive index for the light of the wavelength $\lambda_i$ and e≈2.718. Here, the area $A_{tot}$ is selected so that the distance between an in junction interface of a pin diode formed by the gate of the SIT and the n+-type buried layer and the substrate surface is $$x_i = \frac{1}{\alpha_i(\lambda_i)}$$

(where $\alpha_i$ is the absorption coefficient for the wavelength $\lambda_i$), the impurity density is selected so that a depletion layer in an i-type layer spreads substantially from the in junction interface toward the substrate surface and the thickness Wi of the depletion layer is selected to such a value as expressed approximately by $$Wi = x_i \left(1 - \frac{1}{e}\right)$$

The above conditions impose structural limitations on the thickness and the area of the gate structure of the SIT.

The thickness of the n+-type region, which forms the buried layer, is selected to such an extent that the region serves as filter for infrared light and so on desired to eliminate. Of carriers which are created by light having passed through the n+-type buried layer, holes have no affect on the p+-type gate of the SIT since the n+-type buried layer constitutes a potential barrier against the holes. Accordingly, it is possible to maximize the sensitivity for some specified shorter wavelengths.

It is the basic concept of the present invention to implement the selective responsivity for the specific wavelength $\lambda_i$ in the gate portion of the SIT upon such design criteria as mentioned above. By dividing the gate portion of the SIT and by making each divided portion selectively respective to a different wavelength $\lambda_i$ through utilization of the abovesaid design criteria, a photodetector can be implemented which presents a selective spectral responsivity character for some specified wavelengths $\lambda_i$ by the parallel operation of the divided diodes. Conversely speaking, a photodetector which is selectively responsive to different wavelengths is implemented by one device. With this method, it is also possible, ideally, to obtain with one device photodetection sensitivity characters corresponding to required spectral responsivity characters by dividing the gate portion in a predetermined ratio into individual diode portions and by selecting the gate diffusion depth, the depletion layer width and so forth in each diode portion so that it is selectively responsive to a predetermined wavelength. In this specification, an example of the structure of an SIT photodetector will be described which is selectively responsive to the three wavelengths $\lambda_1$, $\lambda_2$ and $\lambda_3$, and its manufacturing method will also be described in brief. Further, a color image sensor will also be described as an embodiment of the above idea applied to a solid-state image sensing device.

According to the present invention, in the SIT photodetector which has the aforementioned excellent features of a high optical current gain, a high signal-to-noise ratio, a wide dynamic range and a high-frequency operation, the gate structure as a photodetector portion which has selective and sharp responsivity characters for some specified wavelengths and the amplifying characteristic of the SIT are optimized separately, thereby providing a specific device structure and its manufacturing method for materializing an SIT photodetector which has the photodetection sensitivity corresponding to the required spectral responsivity character, as a whole. The quantum efficiency of the gate portion of the SIT is 1 or less, but required responsivity (A/W) can be obtained with the amplifying characteristic of the SIT amplifier. The photodetection sensitivity character, which satisfies the required spectral responsivity characters, is optimized by the photodetecting portion of the gate of the SIT and the amplifying characteristic of the SIT, thereby obtaining a desired spectral responsivity character. Specific dimensions of respective parts and a method of determining their structural limitations will roughly be described, along with the principles of the present invention.

Figure 2:
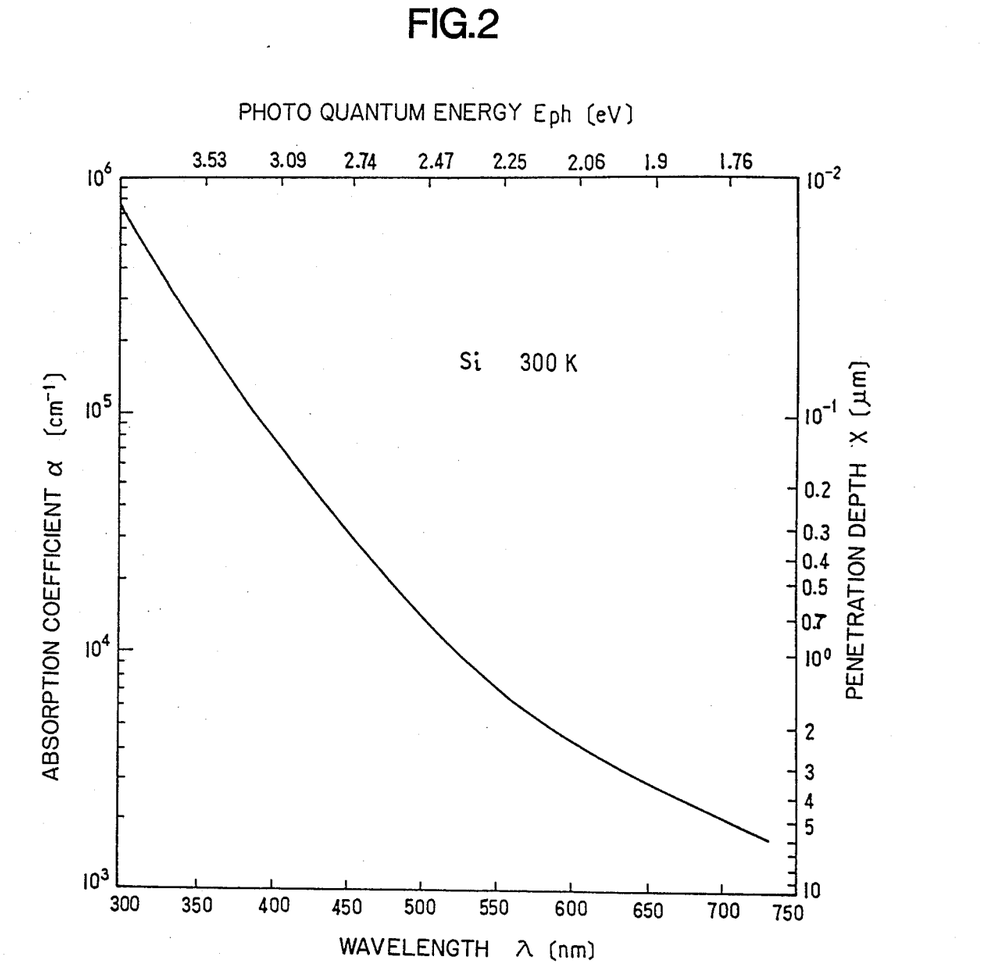
FIG. 2 is a graph explanatory of the present invention, showing the relationships of the light absorption coefficient α of silicon in the case of 300K and the penetration depth x thereinto of light to the wavelength $\lambda$ or photo quantum energy Eph (eV)

In general, when a pn junction semiconductor is irradiated by light, electron-hole pairs are created and these carriers are separated by an electric field present in a depletion layer of the pn junction, that is, holes and electrons flow into the p-type region and the n-type region, respectively, generating a photocurrent. The generation ratio (the probability) of electron-hole pairs in a semiconductor depends upon the wavelength of light incident thereto. The reason for this is that the semiconductor has a specific absorption coefficient for photo quantum energy. For example, silicon has, in the case of 300K, such a relationship between the light absorption coefficient $\alpha$ and the wavelength $\lambda$ (photo quantum energy) or such a relationship between the penetration depth x and the wavelength $\lambda$ as shown in FIG. 2. The generation ratio G(x) of electron-hole pairs by the irradiation with a monochromatic light (h$\nu$) is expressed by $$G(x) = \phi_0(\lambda)\alpha\exp(-\alpha x) = \frac{P_0(\lambda)(1 - R(\lambda))}{Ah\nu} \cdot \alpha\exp(-\alpha x) \quad (1)$$

by referring to Sze: "Physics of Semiconductor Devices", p755 (Wiley, 1981). In the above, $\phi_0(\lambda)$ is the incident light flux, $p_0(\lambda)$ is the light intensity, $R(\lambda)$ is the refractive index for light of the wavelength $\lambda$ and A is the area of the device.

It is evident that the generation ratio G(x) by incident light of a fixed intensity and a fixed wavelength $\lambda$ is maximum within the penetration depth $$x = \frac{1}{\alpha(\lambda)}$$

of light of the wavelength $\lambda$. However, the number of optically excited carriers decreases by recombination and the recombination rate (probability) U(x) also exponentially decreases in the thickwise direction of the semiconductor substrate. Accordingly, the photocurrent density J is expressed by the following equation:

$$J = q(G(x) - U(x)) \cdot \delta \quad (2)$$

where $\delta$ represents the depletion layer width which is infinitesimal about x.

A photodiode which is formed by a combination of photodiodes, each having an area $A(\lambda_i)$ and a junction depth $$x_i = \frac{1}{\alpha_i(\lambda_i)},$$

will draw current which is expressed, as the total current density J, by $$J = \sum_{i=1}^{\infty} J_i \quad (3)$$

Here, the current density across each diode is $$J_i = q(G(x(\lambda_i)) - U(x(\lambda_i))) \cdot \delta \cdot \frac{A(\lambda_i)}{A_{tot}}$$

and $$A_{tot} = \sum_{i=1}^{\infty} A(\lambda_i)$$

Accordingly, the quantum efficiency $\eta(\lambda_i)$ for the fixed wavelength $\lambda_i$ is given by the following equation:

$$\eta(\lambda_i) = \quad (4)$$

$$\frac{J(\lambda)A_{tot}}{P_0} \cdot \frac{h\nu}{q} = \frac{h\nu \cdot \delta \cdot A(\lambda_i)}{P_0} \cdot (G(x(\lambda_i)) - U(x(\lambda_i)))$$

The device responds to the light of the wavelength $\lambda_i$ only in the portion of the area $A(\lambda_i)$, and the portions of the other areas detect the light of the other wavelengths. Accordingly, Eq. (4) can be rewritten as follows:

$$\eta(\lambda) = \quad (5)$$

$$\frac{A(\lambda)}{A_{tot}} \delta(1 - R(\lambda))\alpha \cdot \exp(-\alpha x) - \frac{h\nu\delta A(\lambda)}{P_0} U(x(\lambda))$$

Since the second term on the right side which is determined by the recombination rate is smaller than the first term on the right side, it can be considered that the quantum efficiency for the fixed wavelength $\lambda$ is proportional to the area ratio $$\frac{A(\lambda)}{A_{tot}}.$$

It is considered that the device having such wavelength $\lambda$ selectivity is high in impurity concentration on both sides thereof and includes a $p^+n^+$ junction formed by an abrupt junction. FIG. 3 is explanatory of the principles of the present invention.

Figures 3A, 3C:
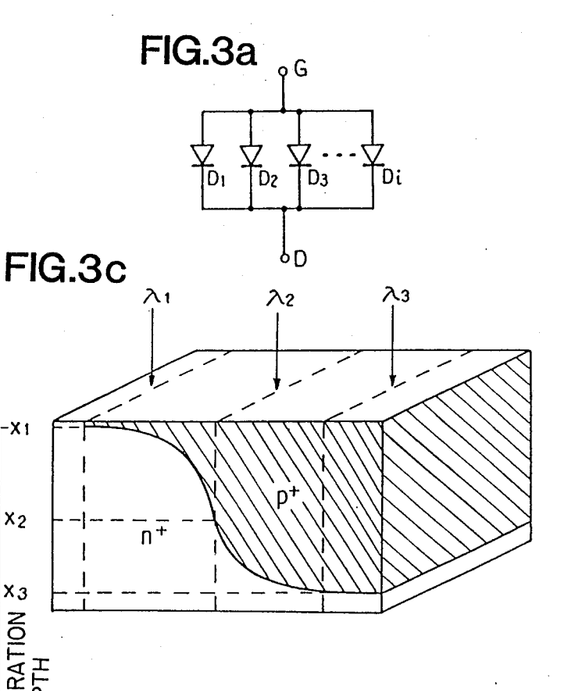
FIGS. 3(a)-3(c) are a series of conceptual diagrams for explaining the principles of the present invention, FIG. 3(a) showing a parallel circuit of gate diodes, FIG. 3(b) the relationship between the penetration depth and the wavelength and FIG. 3(c) an example of a gate diode structure.
Figure 3B:
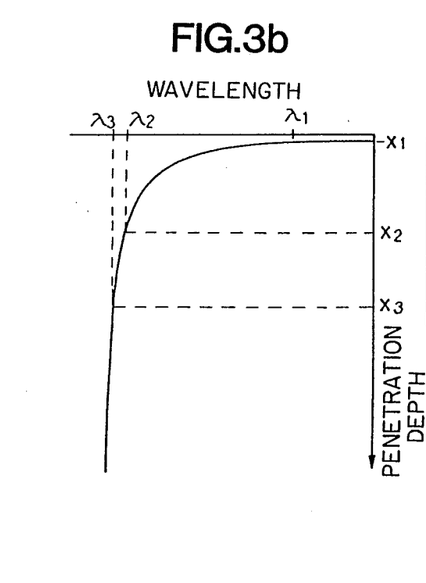

FIGS. 3(a), (b) and (c) are diagrams for explaining the principles of the present invention. Now, consider an idealized $p^+n^+$ junction diode in which the spread of the depletion layer is suppressed and the junction is positioned at the penetration depth so that the pn junction between the gate and the drain of the SIT has sharp wavelength selectivity. In this instance, the area of the $p^+n^+$ junction is divided into individual portions, in each of which the position of the junction plane from the substrate surface is selected equal to $1/\alpha_i(\lambda_i)$ so as to provide sharp photodetection sensitivity for the specific wavelength $\lambda_i$. FIG. 3(a) is an equivalent diode circuit representation in which such divided diodes $D_1$, $D_2$, $D_3$, ... and $D_i$ are connected in parallel. FIG. 3(b) shows the relationship of light penetration depths $x_1$, $x_2$ and $x_3$ to the three wavelengths $\lambda_1$, $\lambda_2$ and $\lambda_3$, and FIG. 3(c) shows that the $p^+n^+$ junction is formed so that the distances of the junction in the respective portions of the device are equal to the abovesaid penetration depths $x_1$, $x_2$ and $x_3$ corresponding to the wavelengths $\lambda_1$, $\lambda_2$ and $\lambda_3$, respectively. In the above example, letting $\eta(\lambda_i)$ represent the quantum efficiency that is required, if the area ratio of the device is selected as follows:

$$\frac{A(\lambda_1)}{A_{tot}} \simeq e\eta(\lambda_1) \frac{1}{1 - R(\lambda_1)},$$

$$\frac{A(\lambda_2)}{A_{tot}} \simeq e\eta(\lambda_2) \frac{1}{1 - R(\lambda_2)},$$

$$\frac{A(\lambda_3)}{A_{tot}} \simeq e\eta(\lambda_3) \frac{1}{1 - R(\lambda_3)} \text{ and}$$

$$A(\lambda_1) + A(\lambda_2) + A(\lambda_3) = A_{tot}$$

and if the position of the junction plane is selected to be $$x_i = \frac{1}{\alpha_i(\lambda_i)},$$

it is possible in principle to obtain diodes which have sharp photodetection sensitivities for the specified wavelengths $\lambda_1$, $\lambda_2$ and $\lambda_3$.

The distance between the $p^+n^+$ junction plane and the device surface in FIG. 3(c) varies with a function which is determined by the relation between a given quantum efficiency $\eta$ and the wavelength $\lambda$, and it depends as well upon other parameters which affect the quantum efficiency $\eta$, such as $A(\lambda)$ and $R(\lambda)$. Here, $R(\lambda)$ is reflectivity. Conversely speaking, it is possible ideally to adjust the photodetection sensitivity by adjusting the depth of the pn junction relative to given $\eta(\lambda)$.

From Eq. (5) in which the term determined by the recombination rate $U(x(\lambda))$ is neglected, the maximum value of the quantum efficiency by monochromatic light irradiation is given under the conditions $$\alpha = \frac{1}{x} = \frac{1}{\delta}$$

and $A(\lambda) = A_{tot}$, if reflection is neglected. Even such a maximum value of the quantum efficiency $\eta$ is always smaller than 1. That is to say, $$\eta_{max} = \frac{1}{e}.$$

However, it can be amplified to a desired sensitivity (A/W) by the amplifying characteristic which is provided by the operation of the SIT portion.

Figure 4:
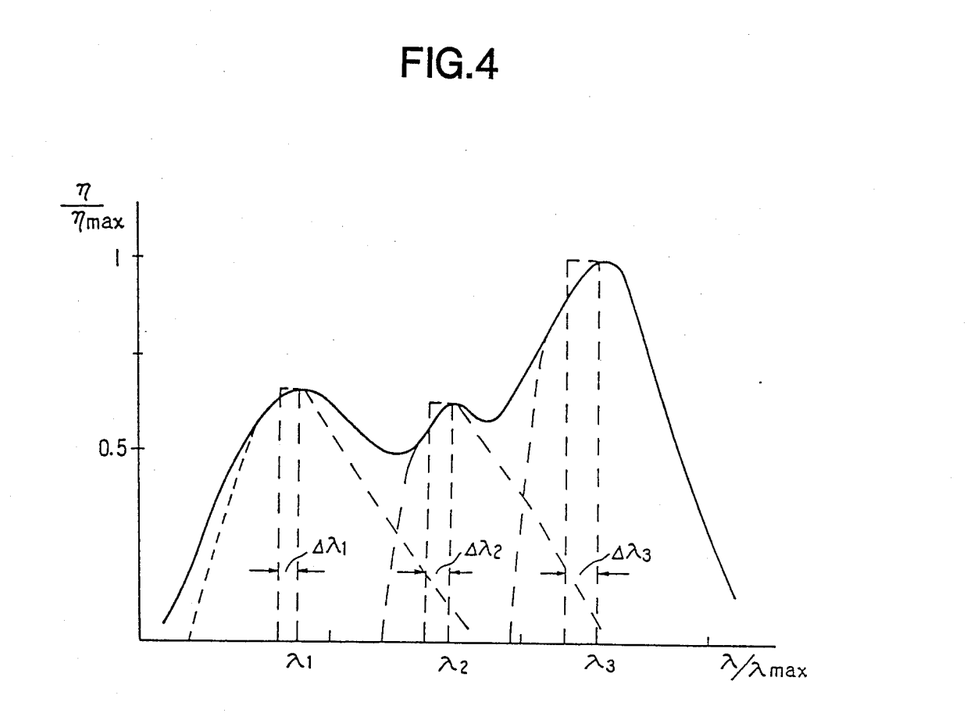
FIG. 4 is a graph showing an example of a quantum efficiency curve having peak values at wavelengths $\lambda_1$, $\lambda_2$ and $\lambda_3$, for explaining the principles of the present invention.

In practice, however, a certain depletion layer width must be taken into account in the pn junction and an abrupt junction cannot always be formed on either side of the depletion layer. Furthermore, an appreciable number of minority carriers flow into the depletion layer owing to diffusion, other than carriers created therein, and they are attracted to the p- and n-type regions. This leads to an increase in the sensitivity for a certain wavelength but markedly decreases the sharp wavelength selectivity, impairing the reproducibility of the relationship between the given quantum efficiency $\eta$ and the wavelength $\lambda$. FIG. 4 shows, by way of example, a function of the required quantum efficiency $\eta$ and the wavelength $\lambda$, $\eta$ on the ordinate and $\lambda$ on the abscissa both being normalized relative to their maximum values $\eta_{max}$ and $\lambda_{max}$, respectively. A spectral response of the quantum efficiency $\eta$ which has such three sensitivity peaks as shown in FIG. 4 can roughly be approximated by three steps $i = 1, 2, 3$ each of which corresponds to the maximum value $\eta_{imax}$ for the wavelength $\lambda_i$. The maximum depth $x_{imax}$ of the depletion layer for detecting the wavelength $\lambda_i$ corresponds to the maximum penetration depth of the photo quantum energy $h\nu_i$, and the width of the depletion layer is similarly determined by $\Delta\lambda_i$. The pin diode has a convenient structure since the thickness of the depletion layer can be conformed to the $\eta$-$\lambda$ curve by a suitable selection of the thickness of the i-type region. Where the $p^+$- and $n^+$-type regions are each doped to a sufficiently high impurity concentration, the depletion region only slightly spreads into the $p^+$- and $n^+$-type regions other than the $n^-$-type region at a diffusion potential or a suitable reverse bias voltage. An increase in the wavelength of light to be detected poses a problem in the diffusion length of minority carriers, and the minority carriers that are created within their diffusion length from the end of the depletion layer in the p+- and n+-type regions also affect the quantum efficiency of the device. Especially, when the wavelength of light to be detected increases, the spectral response of the quantum efficiency of the pin diode designed to provide a sharp quantum efficiency for a specified wavelength alone spreads out at the base. The reason for this is as follows: Consider the case where the surface of the pin diode is p-type and light incident thereto from the side of the p-type region perpendicularly to the junction plane of the device. Since light of longer wavelength increases more and more their penetration depth, the number of holes which are created as minority carriers within their diffusion length from the end of the depletion layer in the n-type region increases, and these holes raise the quantum efficiency in the vicinity of the wavelength λ. Accordingly, in the case of the abovesaid pin diode, the depletion layer width should be selected so that the depletion layer spreads out from the penetration depth $x_{imax}$ toward the surface of the device, and a practical limitation on the thickness Wi of the depletion layer, for each wavelength $\lambda_i$, is given by the following equation:

$$Wi = x_{imax}\left(1 - \frac{1}{e}\right)$$

Where $x_{imax}$ is just the distance from the surface of the device to the in junction interface. The reason for which the width Wi of the depletion layer is selected as expressed by the above equation is that $x_{imax}$ is the penetration depth of light of the wavelength $\lambda_i$, whereas the light of the wavelength $\lambda_i$ is most effectively absorbed in the range from the depth $x_{imax}/e$ to the depth $x_{imax}$. For the spectral responsivity character (the η-λ curve) having a different maximal value $\eta_i$, it is necessary to take the area ratio $A(\lambda_i)/A_{tot}$ into consideration, as indicated by Eq. (5). In the example of FIG. 2, the absorption coefficient α varies on one or one and half orders of magnitude in the visible region. The generation ratio G(x) of electron-hole pairs by light is in proportion to the absorption coefficient α and takes a certain effective value decreased by the recombination rate U(x) which is determined experimentally. The refractive index R(λ) having spectral dependence can be incorporated into the area ratio $A(\lambda_i)/A_{tot}$ in accordance with Eq. (5). Eventually, the term which affects the quantum efficiency for each specified wavelength $\lambda_i$, except the diffusion of the minority carriers, can be incorporated in the area $A(\lambda_i)$ of each divided device. By applying this very simple concept a device of photodetection sensitivity conforming to a required spectral responsivity character can be designed based on the design of a device taking into account such two spectral responses as shown in FIGS. 5(a), (b) and (c) and their results.

For instance, in the case of an n-channel normally-ON SIT which operates in a reverse-biased condition, the potential of the p+-type gate region biased to a certain operating point relative to the n+-type drain region is determined by a change in incident light. The potential of the channel at an intrinsic gate point is controlled by the gate potential and is partly controlled as well by the drain potential by virtue of the static induction effect that is the operational principle of the SIT. Accordingly, light exerts only indirect influence on potential barrier control through variations in the gate potential. Optically excited holes are accumulated in the depth of a potential well of the p+-type gate, and in order to effectively modulate a majority carrier (electron) current flowing through the channel by photodetection, it is preferable that the bottom of the potential well of the gate be positioned as close to the channel as possible.

Figure 5A:
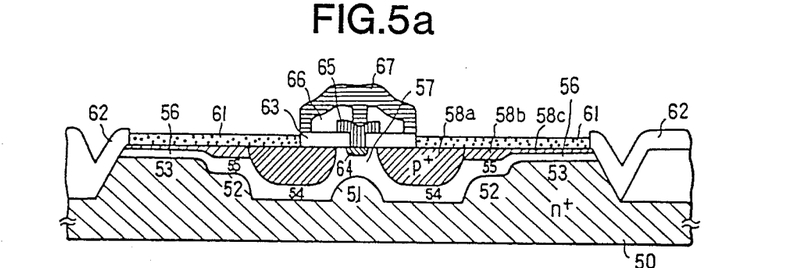
FIGS. 5(a)-5(c) illustrates an embodiment of the present invention, FIG. 5(a) being a cross-sectional view, FIG. 5(b) an explanatory diagram showing the potential distribution and a carrier transport in the gate and FIG. 5(c) a plan view.

FIG. 5(a) illustrates in cross-section the structure of the photodetector of the present invention which has the spectral selectivity. Disposed centrally of the device is an SIT which has an n+-type buried layer 51 as the drain region, and the n+-type buried layer 51 is raised toward a source 64 in the channel portion in a manner to shorten the effective channel 57 of the SIT. The n+-type regions 52 and 53 are both formed by diffusion from a buried layer 50 so that they define the thicknesses of high resistivity n−-(p−, i-)type layers 55 and 56, respectively. The gate region of the SIT is also formed by three regions 58a, 58b and 58c. The p+-type region 58a is a region for controlling a current flow between an n+-type source region 64 and the n+-type drain region 51 (50), and at the same time, it functions as a photodetector for a relatively long wavelength, for example, in the vicinity of 600 nm. On the other hand, the p-type region 58b is electrically connected to the p+-type gate region 58a, but performs the function of a photodetector for a shorter wavelength, for instance, green light of about 550 nm. The p-type region 58c is electrically connected to the p+-type region 58a and the p-type region 58b and forms a part of the SIT, but it can be made to serve as a photodetector for light of further shorter wavelength, for instance, blue light of about 450 nm. The n+-type region 52 is a region for limiting the thickness of the n−-type high resistivity layer 55. By limiting the width of the high resistivity layer of a pin diode which is made up of the p-type region 58b, the n−-type region 55 and the n+-type region 52, desired spectral selectivity is obtained. Similarly, the thickness of the n−-type high resistivity layer 56 is also limited by the n+-type region 53. The following table 1 shows, by way of example, dimensions of respective regions which are selected for obtaining selective photodetection sensitivity for three wavelengths 460, 550 and 660 nm.

TABLE 1

|   | $x_{imax}$ | Wi | $x_{jp+max}$ | $-x_{jn+}$ | λ |
|---|---|---|---|---|---|
| B | 0.63 μm | 0.4 | 0.2 | 3.0 | 460 nm |
| G | 1.53 μm | 0.9 | 0.5 | 2.2 | 550 |
| R | 3.57 μm | 2.3 | 1.3 | 0 | 660 |

In the above, $x_{imax}$ is the distance from the surface of a silicon layer to the n−(p−, i)n+ junction interface, Wi is the thickness of a depletion layer which spreads from the n−(p−, i)n+ junction plane toward the surface of the silicon layer and is selected so that $$Wi = x_{imax}\left(1 - \frac{1}{e}\right),$$

$x_{jp+max}$ is the junction depth of the p-type diffused layer and $-x_{jn+}$ is the heights of the n+-type layers 52 and 53.

Figure 5B:
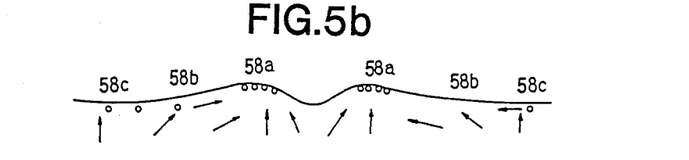
Figure 5C:
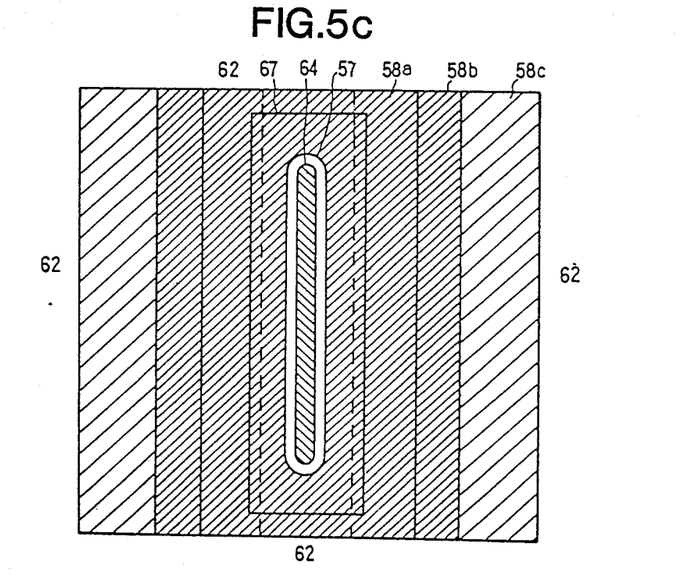

In FIG. 5(a), reference numeral 61 indicates a gate electrode formed by a p+-type polysilicon layer or transparent electrode, and it is connected to the p-type regions 58a, 58b and 58c. Reference numeral 62 designates a V-shaped groove formed by an anisotropic etching or like process, and it serves as an isolation region. Reference numeral 63 identifies an SiO2 film, 64 an n+-type source diffused region, 65 a source electrode formed of n+-type polysilicon, 66 an insulating film of PSG or CVD SiO2 and 67 an aluminum electrode which is in contact with the source electrode 65. FIG. 5(b) the potential profile for holes in the regions 58a, 58b and 58c sectioned in a plane parallel to the surface of the silicon layer. White circles ( o ) indicate holes and the arrows the direction of their movement. By grading the impurity concentration in the same p-type region so that the impurity concentration is the highest in the p-type region 58a and becomes gradually lower in the regions 58b and 58c, the p+-type region 58a is the place where the optically excited holes are stored most easily. FIG. 5(c) is a plan view of the photodetector shown in FIG. 5(a). The n+-type region 64 is completely surrounded by the p+-type diffused region 58a. The distance from the inner end of the p-type region 58c to the source region 64 is selected less than the diffusion length of the holes.

Figure 6:
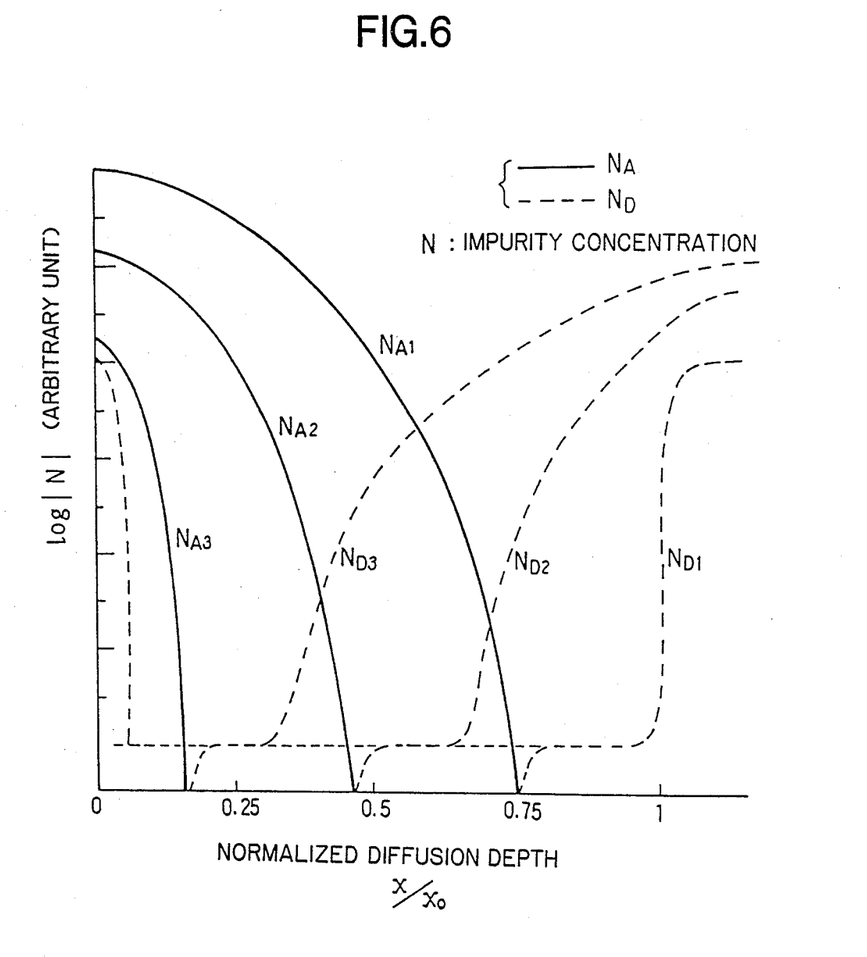
FIG. 6 is a graph showing the relationships of the impurity concentration profile in a pin diode portion of the gate in the SIT depicted in FIG. 5.

FIG. 6 shows the impurity concentration profiles in the respective parts of the pin diode formed by the gates 58a, 58b and 58c, the high resistivity layers 54, 55 and 56 and the n+-type layers 50, 52 and 53. Acceptor impurity concentration profiles ($N_A$) are indicated by the solid lines and donor impurity concentration profiles ($N_D$) by the broken lines. The n+-type regions 50, 52 and 53 and the p-type regions 58a, 58b and 58c can be formed through use of a selective diffusion technique in accordance with the structure shown in FIG. 6. In FIG. 6, the ordinate represents the impurity concentration log $|N|$ on a logarithmic scale and the abscissa a normalized dimension in the vertical direction (a diffusion depth) $x/x_0$. Here, the normalized constant $x_0$ is the penetration depth, $$x = \frac{1}{\alpha(x)} = x_0,$$

of light of the longest one of the wavelengths for which the quantum efficiency assumes maximal values in the required $\eta$-$\lambda$ curve. The depth $x_0$ just corresponds to the deepest bottom of the depletion layer. $N_{A1}$, $N_{A2}$ and $N_{A3}$ respectively correspond to the impurity concentration profiles in the p-type diffused regions 58a, 58b and 58c, and $N_{D1}$, $N_{D2}$ and $N_{D3}$ respectively correspond to the impurity concentration profiles in the n-type regions 50, 52 and 53.

The SIT photodetector having the spectral selectivity, shown in FIG. 5, can be fabricated using, for example, silicon, by the employment of such a manufacturing process as disclosed in another application (Pat. Appln. No. 249545/83). An n+- or p-type substrate is used. It is preferable, in this case, to employ the p-type substrate because a high impurity concentration n+-type buried layer which is formed on the p-type substrate absorbs holes which are created by near-infrared light of a large penetration length. Accordingly, a structure with a buried layer can be used in place of an infrared cutoff filter which is usually employed.

Figure 7:
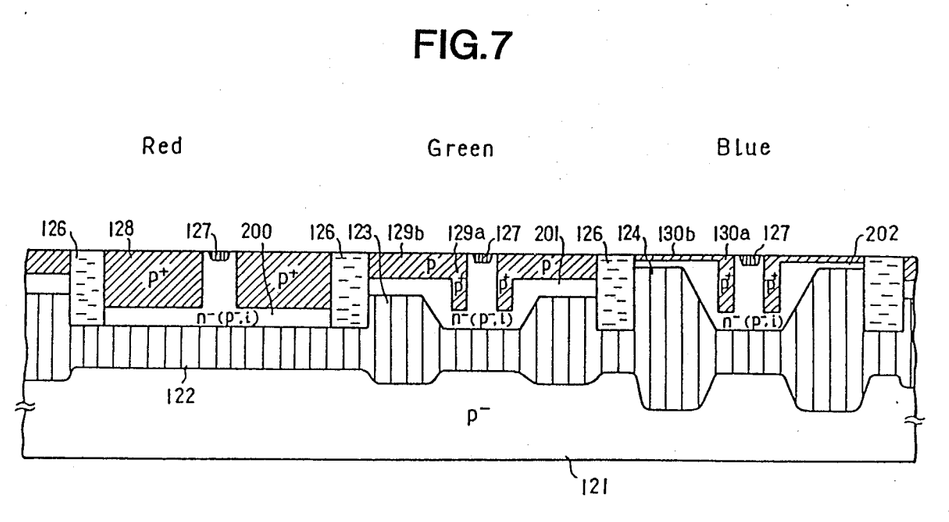
FIG. 7 is a cross-sectional view illustrating are as for detecting green, red and blue lights in the color image sensor of the present invention.

Next, a method of manufacturing an SIT color image sensor which utilizes the structure of the SIT photodetector having the function of selectively detecting light of specified wavelengths will be described with reference to its specific embodiment. FIG. 7 illustrates in cross-section the device structure. In order to obtain the function of selectively detecting the wavelengths of blue, green and red light, limitations are imposed on the diffusion depths of gate regions 128, 129a, 129b, 130a and 130b, the thicknesses of n+-type buried layers 122, 123 and 124 and the thicknesses of high resistivity layers 200, 201 and 202 in respective pixels. For instance, for wavelengths 460, 550 and 660 nm, the dimensions of the respective parts are selected to have the values given in Table 1. The buried layers 122, 123 and 124 are formed in a p−-type substrate 121 and then the high resistivity epitaxial layers 200, 201 and 202 are formed. The buried layers 122, 123 and 124 are formed in required patterns by selectively implanting ions of donor impurities of different diffusion constants and through utilization of the difference in the diffusion rate during their rediffusion which is caused by subsequent heat treatment for epitaxial growth or the like. The doses of impurities for ion implantation are determined taking into account the temperature and time for the subsequent heat treatment. An epitaxial growth process, a field oxidation process and diffusion processes for the formation of the gate regions 128, 129a, 129b, 130a and 130b and the source region 127 are main heat treatment processes. The p+-type gate diffused regions 128, 129a, 129b, 130a and 130b can also be formed in desired patterns by performing local ion implantation and drive-in diffusion of boron in the same manner as that for the formation of the gate regions of the SIT, or by carrying out such processes in a plurality of stages, or by a combination thereof. For the formation of the shallowest diffused region 130b for detecting the shorter wavelength, it is desirable to effect the implantation of B+ and Si+ ions at a low acceleration voltage of 20 to 50 KeV and heat treatment at a low temperature below 700° C. The diffusion of an n+-type source region 127 takes place at the same time as the drive-in diffusion of the p+-type gate regions 128, 129b, 129a, 130a and 130b. An n+-type impurity doped polysilicon layer for wiring the n+-type source region 127 and a MIS capacitor and a gate address line which overlie the gate regions 128, 129a, 129b, 130a and 130b, etc., though not shown in FIG. 7, can be formed by methods disclosed in other applications. Thus the gate storage mode SIT color image sensor can be obtained.

Figure 8:
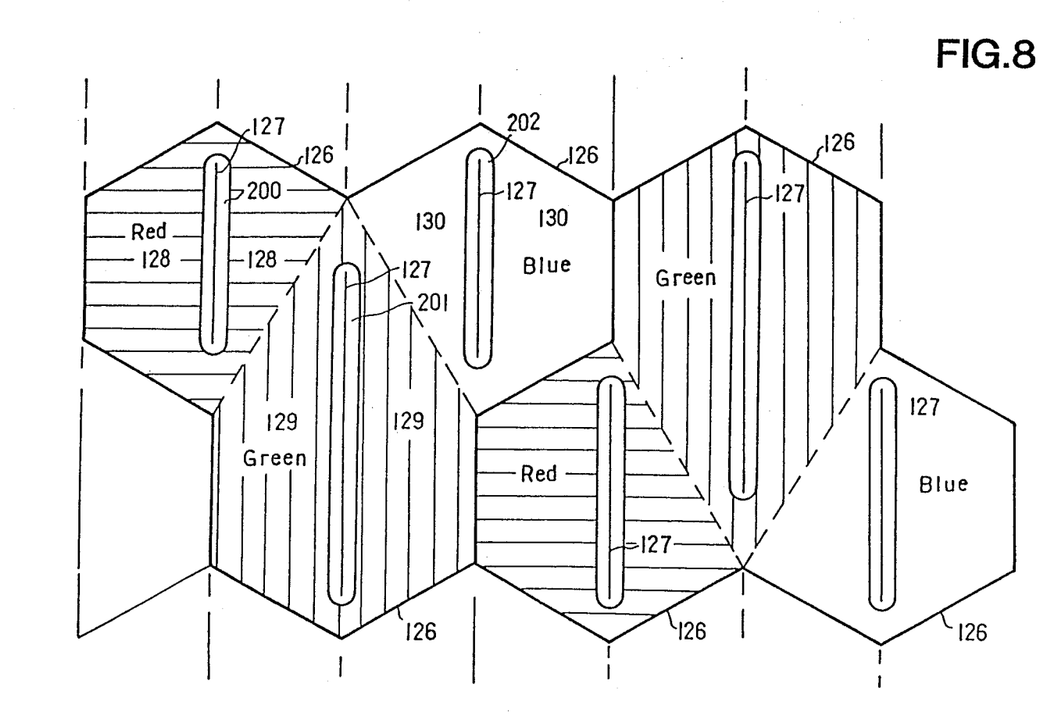
FIG. 8 is a plan view of FIG. 7.

FIG. 8 is a plan view of the SIT color image sensor shown in FIG. 7. Red, blue and green pixels are each disposed in a hexagonal pattern, and the area of the green pixel is made at least 1.6 times larger than the areas of the red and blue pixels. Reference numerals in the respective parts correspond to those in FIG. 7. The source of the green pixel is made twice longer than in the other pixels.

Figure 9:
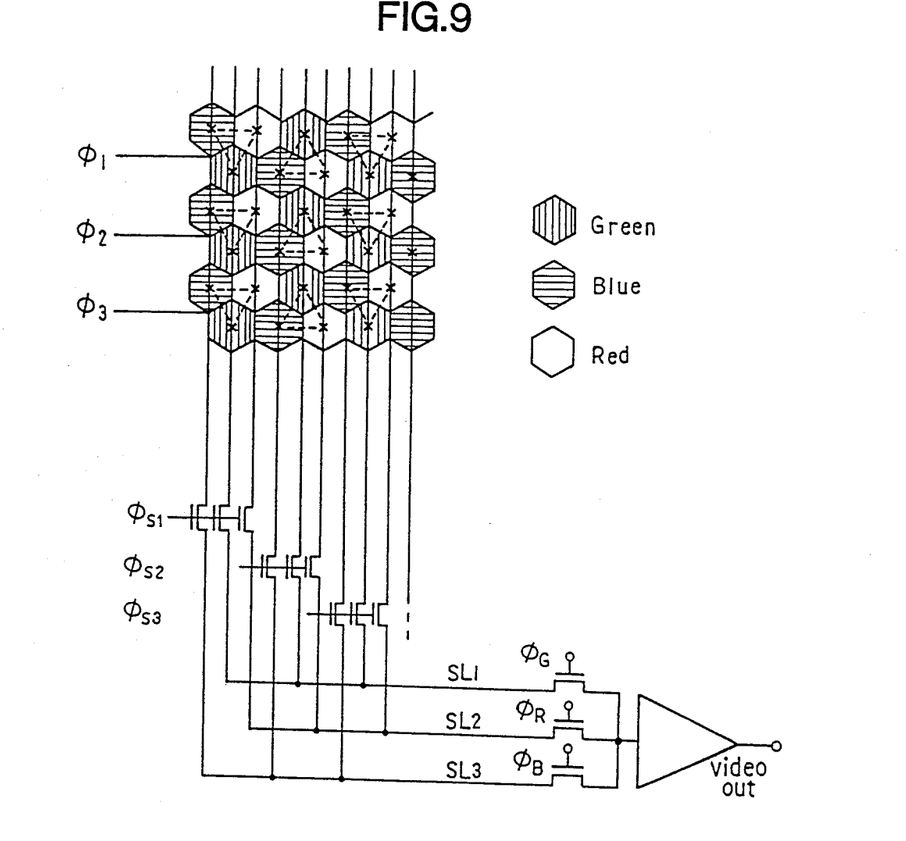
FIG. 9 is a partial circuit circuit diagram for explaining a signal readout method.

FIG. 9 is a diagram for explaining a method of readout of an image sensor matrix which has the plan pattern shown in FIG. 8. Signals of the respective green, red and blue pixels are read out from separate signal readout lines SL1, SL2 and SL3 by sequential switching of horizontal signal address switching pulses $\phi_{s1}$, $\phi_{s2}$, $\phi_{s3}$, ... $\phi_1$, $\phi_2$, $\phi_3$, ... are vertical signal address gate pulses for simultaneous addressing of the green, red and blue pixels. The green, red and blue colors are separated by pulses $\phi_G$, $\phi_R$ and $\phi_B$ corresponding thereto in the duration of the pulse $\phi_{si}$ and the separated signals are applied to one video amplifier and are detected as a serial signal at the video output terminal. The image sensor of the present invention, shown in FIGS. 7 to 9, is capable of detecting a color image without the necessity of providing a color filter outside the device. Moreover, the green, red and blue pixels can be fabricated concurrently by forming the predetermined p+-type gate structure and n+-type buried structure through use of the selective ion implantation technique for obtaining the selective spectral characters. It is also possible to produce an SIT image sensor matrix which has the same spectral sensitivity as do such color filter arrangements as a checker pattern, a Bayer pattern and so forth. Furthermore the arrangement of the green, blue and red pixels can be obtained with the highest integration density, and the wiring for signal readout by an X-Y address system is also easy. In the image sensor of the present invention, since the sensor area has the buried layer, unnecessary infrared information can be removed, reducing a dark current.

With the SIT photodetector of the cross-sectional structure of FIG. 5, shown as an embodiment of the present invention, it is possible to obtain selective spectral responsivity for three specified wavelengths. According to the embodiment illustrated in FIG. 7, an image sensor of the X-Y address system can be implemented by assembling three kinds of pixels which are selectively responsive to green, red and blue light. It has been proposed to improve the blue light response by reducing the gate diffusion depth of the SIT, but the present invention points out that the mere reduction of the gate diffusion depth is insufficient and proposes that the thickness of the depletion layer must be limited, which is accomplished by determining the thickness of the high resistivity layer by selecting the shape of the n+-type substrate or the n+-type buried layer. Further, the present invention proposes a method of determining concrete dimensions of respective parts. In addition, specific dimensions of a photodetector which are selectively responsive to some specified wavelengths by a combination of the above concepts are given in Table 1, besides the present invention has also been described as being applied to an SIT color image sensor.

While the present invention has been described mainly in connection with the case of using silicon, it is also possible to implement, using other materials, a photodetector or imaging device which is selectively responsive to other wavelengths on the basis of the same concept taking the absorption curve into account.

What is claimed is:

1. A photodetector-type color image sensor formed by a static induction transistor, comprising:
    an n+-type buried layer, forming one of a drain and a source region;
    a high resistivity i-type layer formed above said n+-type buried layer;
    a p-type region, formed on said i-type layer, forming a gate having a surface area $A(\lambda_i)$ for selectively detecting light of a specific wavelength $\lambda_i$ (where i=1, 2, 3, corresponding to blue, green and red light) and a total area $A_{tot}$ of the gate being defined as follows:

$$\frac{A(\lambda_i)}{A_{tot}} = e\eta(\lambda_i) \frac{1}{1 - R(\lambda_i)},$$

where e=2.718, $\eta(\lambda_i)$ is a required quantum efficiency for the specific wavelength $\lambda_i$, $R(\lambda_i)$ is a refractive index for the specific wavelength $\lambda_i$ and $A_{tot}=A(\lambda_1)+A(\lambda_2)+A(\lambda_3)$, said p-type region being divided into areas for detecting light of three different wavelengths, arranged in a honeycomb-like pattern, the p-type region having a diffusion depth $x_{jp+}$ and a depletion width Wi between the gate and said n+-type buried layer selected close to $x_{jp+}=0.2$ μm, 0.5 μm, 1.3 μm and Wi=0.4 μm, 0.9 μm, 2.3 μm for blue, green and red light, respectively, so that photodetection sensitivity of each of the wavelengths is maximum, the area of the gate for detecting green light being at least 1.6 times larger than either of the areas of the gate for detecting red and blue light.

2. A photodetector formed by a static induction transistor, comprising:
    an n+-type buried layer forming one of a drain and a source region of said photodetector;
    a high resistance i-type layer formed on said n+-type buried layer, with a junction therebetween;
    a p-type region, formed on said i-type layer, forming a gate, said photodetector having light $_i$ incident to a surface and an absorption coefficient $\alpha_i(\lambda_i)$ for the light $\lambda_i$, a distance $x_i$ between the junction of said n+-type and i-type layers and the surface of said photodetector being defined by:

$$x_i = \frac{1}{\alpha_i(\lambda_i)},$$

a ratio between the surface area $A(\lambda_i)$ of a gate portion for selectively detecting light of a specified wavelength $\lambda_i$ and the total area $A_{tot}$ of the gate being selected as follows:

$$\frac{A(\lambda_i)}{A_{tot}} = e\eta(\lambda_i) \frac{1}{1 - R(\lambda_i)},$$

where e=2.718, $\eta(\lambda_i)$ is a required quantum efficiency for the wavelength $\lambda_i$ and $R(\lambda_i)$ is a refractive index for the wavelength $\lambda_i$, a depletion layer being formed in said detector with a thickness $W_i$ and a maximum depth $x_{imax}$ corresponding to the specified wavelength $\lambda_i$ being selected as follows:

$$Wi = x_{imax}\left(1 - \frac{1}{e}\right) \text{ and } x_{imax} = \frac{1}{\alpha_i(\lambda_i)},$$

thereby providing selective spectral responsivity for the specified wavelength $\lambda_i$.

3. A photodetector according to claim 2, wherein a plurality of specified wavelengths are represented by $\lambda_1$, $\lambda_2$ and $\lambda_3$, respectively, and a ratio $A(\lambda_i)/A_{tot}$ is selected as follows:

$$\frac{A(\lambda_1)}{A_{tot}} = e\eta(\lambda_1) \cdot \frac{1}{1 - R(\lambda_1)}$$

$$\frac{A(\lambda_2)}{A_{tot}} = e\eta(\lambda_2) \cdot \frac{1}{1 - R(\lambda_2)}$$

$$\frac{A(\lambda_3)}{A_{tot}} = e\eta(\lambda_3) \cdot \frac{1}{1 - R(\lambda_3)},$$

where $A_{tot}=A(\lambda_1)+A(\lambda_2)+A(\lambda_3)$, whereby photodetection sensitivity conforming to a required spectral responsivity character is obtained with the gate serving as a photo-detecting portion.

* * * * *